(12) United States Patent
Kishida et al.

(10) Patent No.: US 11,328,913 B2
(45) Date of Patent: May 10, 2022

(54) SPUTTERING DEVICE

(71) Applicant: NISSIN ELECTRIC CO., LTD., Kyoto (JP)

(72) Inventors: Shigeaki Kishida, Kyoto (JP); Daisuke Matsuo, Kyoto (JP)

(73) Assignee: NISSIN ELECTRIC CO., LTD., Kyoto (JP)

( * ) Notice: Subject to any disclaimer, the term of this patent is extended or adjusted under 35 U.S.C. 154(b) by 32 days.

(21) Appl. No.: 16/494,773

(22) PCT Filed: Mar. 14, 2018

(86) PCT No.: PCT/JP2018/010013
§ 371 (c)(1),
(2) Date: Sep. 17, 2019

(87) PCT Pub. No.: WO2018/168942
PCT Pub. Date: Sep. 20, 2018

(65) Prior Publication Data
US 2020/0027708 A1 Jan. 23, 2020

(30) Foreign Application Priority Data
Mar. 17, 2017 (JP) .............................. JP2017-053128

(51) Int. Cl.
H01J 37/34 (2006.01)
C23C 14/34 (2006.01)
C23C 14/50 (2006.01)

(52) U.S. Cl.
CPC .......... H01J 37/3488 (2013.01); C23C 14/34 (2013.01); C23C 14/50 (2013.01);
(Continued)

(58) Field of Classification Search
CPC .............. H01J 37/3488; H01J 37/3435; H01J 2237/20228; H01J 2237/3323;
(Continued)

(56) References Cited

U.S. PATENT DOCUMENTS

| 5,614,055 A * | 3/1997 | Fairbairn | H01J 37/321 156/345.33 |
| 2001/0017109 A1* | 8/2001 | Liu | H01J 37/32412 118/723 I |

(Continued)

FOREIGN PATENT DOCUMENTS

| CN | 103147055 | 6/2013 |
| CN | 103147055 A * | 6/2013 |

(Continued)

OTHER PUBLICATIONS

JP-2014037555-A Translation (Year: 2014).*
(Continued)

Primary Examiner — Jennifer Wecker
Assistant Examiner — Patrick S Ott
(74) Attorney, Agent, or Firm — JCIPRNET

(57) ABSTRACT

The purpose of the present invention is to improve uniformity of film deposition by a plasma-based sputtering device. Provided is a sputtering device 100 for depositing a film on a substrate W through sputtering of targets T by using plasma P, said sputtering device being provided with a vacuum chamber 2 which can be evacuated to a vacuum and into which a gas is to be introduced; a substrate holding part 3 for holding the substrate W inside the vacuum chamber 2; target holding parts 4 for holding the targets T inside the vacuum chamber 2; multiple antennas 5 which are arranged along a surface of the substrate W held by the substrate holding part 3 and generate plasma P; and a reciprocal scanning mechanism 14 for scanning back and forth the (Continued)

substrate holding part 3 along the arrangement direction X of the multiple antennas 5.

3 Claims, 9 Drawing Sheets

(52) U.S. Cl.
CPC . *H01J 37/3435* (2013.01); *H01J 2237/20228* (2013.01); *H01J 2237/3323* (2013.01)

(58) Field of Classification Search
CPC ...... H01J 37/3211; C23C 14/34; C23C 14/50; C23C 14/0036; C23C 14/3471; C23C 14/3464; C23C 14/352; H05H 1/46
See application file for complete search history.

(56) References Cited

U.S. PATENT DOCUMENTS

| | | | | |
|---|---|---|---|---|
| 2007/0193512 A1* | 8/2007 | Deguchi | ........... | H01J 37/32192 118/723 I |
| 2011/0203922 A1* | 8/2011 | Setsuhara | ............. | C23C 14/358 204/298.16 |
| 2012/0067281 A1* | 3/2012 | Suzuki | ............. | H01L 21/02211 118/708 |
| 2012/0080309 A1* | 4/2012 | Bender | ................. | C23C 14/352 204/192.12 |
| 2013/0221833 A1* | 8/2013 | Kudela | .................. | H01Q 13/22 313/231.31 |
| 2016/0099130 A1* | 4/2016 | Ando | ................ | H01J 37/32522 315/111.21 |

FOREIGN PATENT DOCUMENTS

| | | | |
|---|---|---|---|
| CN | 104658847 | 5/2015 | |
| CN | 105491780 | 4/2016 | |
| JP | H11246969 | 9/1999 | |
| JP | 2012074459 A * | 4/2012 | ............... H05H 1/46 |
| JP | 2012158835 | 8/2012 | |
| JP | 2014037555 | 2/2014 | |
| JP | 2014037555 A * | 2/2014 | |
| JP | 2015172240 | 10/2015 | |
| JP | 2017004602 | 1/2017 | |
| KR | 20130100325 | 9/2013 | |
| KR | 20140099340 | 8/2014 | |
| KR | 20160039558 | 4/2016 | |
| TW | 201309106 | 2/2013 | |
| WO | 2016047184 | 3/2016 | |

OTHER PUBLICATIONS

JP2012074459 Translation (Year: 2012).*
CN-103147055-A Translation (Year: 2013).*
Office Action of Korea Counterpart Application, with English translation thereof, dated Jul. 8, 2020, pp. 1-10.
Office Action of Korea Counterpart Application, with English translation thereof, dated Dec. 3, 2020, pp. 1-6.
"International Search Report (Form PCT/ISA/210)" of PCT/JP2018/010013, dated Jun. 5, 2018, with English translation thereof, pp. 1-3.
"Office Action of China Counterpart Application", dated Jan. 12, 2021, with English translation thereof, pp. 1-16.
"Office Action of Taiwan Counterpart Application" with English translation thereof, dated Apr. 15, 2021, p. 1-p. 11.
"Office Action of China Counterpart Application" with English translation thereof, dated Aug. 20, 2021, p. 1-p. 16.
"Office Action of China Counterpart Application", dated Mar. 18, 2022, with English translation thereof, p. 1-p. 11.

* cited by examiner

SPUTTERING DEVICE

CROSS-REFERENCE TO RELATED APPLICATION

This application is a 371 of international application of PCT application serial no. PCT/JP2018/010013, filed on Mar. 14, 2018, which claims the priority benefit of Japan application no. 2017-053128, filed on Mar. 17, 2017. The entirety of each of the abovementioned patent applications is hereby incorporated by reference herein and made a part of this specification.

BACKGROUND

Technical Field

The present invention relates to a sputtering device which deposits a film on a substrate by sputtering a target using plasma.

Description of Related Art

As this type of sputtering device, a magnetron sputtering device is known. This magnetron sputtering device has a configuration in which a magnet provided on a back surface of a target forms a magnetic field on a surface of the target to generate plasma, and ions in the plasma collide with the target to cause sputtered particles to be ejected from the target.

In a conventional magnetron sputtering device, variations in plasma density are generated in the plasma generated in a vicinity of a surface of a target, and accordingly, the target is unevenly consumed and a utilization rate of the target is decreased. Also, when the target is unevenly consumed, a film thickness generated thereby is also uneven.

In order to solve this problem, as described in Japanese Patent Laid-Open No. 2012-158835 and Japanese Patent Laid-Open No. H11-246969, a configuration in which a magnet, a target, or a substrate is caused to swing or rotate, and a configuration in which a distance between a target and a substrate is controlled have been considered.

However, in order to eliminate the variations in plasma density generated due to the magnet by swinging, rotating, or the like of the magnet, the target, or the substrate, a complicated mechanism and control are required. Also, even with such a complicated mechanism and control, sufficient efficiency of use of the target and film deposition uniformity cannot be easily realized.

On the other hand, the inventor of the present invention has been developing a sputtering device in which an antenna is disposed in the vicinity of a target and a high-frequency current is caused to flow in the antenna to generate plasma for sputtering as described in PCT International Publication No. WO 2016/047184, instead of the above-described magnetron sputtering device. When plasma is generated using the antenna, variations in plasma density are small compared to that in a configuration of generating plasma using a magnet. By reducing the variations in plasma density, efficiency of use of the target and uniformity of film deposition are expected to improve.

However, in order to cope with an increase in size of a substrate or the like in recent years, a plurality of antennas need to be disposed for one or a plurality of targets. When a plurality of antennas is disposed as described above, not only is density gradation generated in distribution of plasma due to a disposition pattern of the plurality of antennas, but density gradation is also generated in distribution of sputtered particles ejected from the targets. As a result, a generated film thickness becomes uneven.

SUMMARY

Therefore, the present invention has been made to solve the problems described above, and a main objective thereof is to improve uniformity of film deposition when plasma for sputtering is generated using a plurality of antennas.

That is, a sputtering device according to an aspect of the present invention is a sputtering device which deposits a film on a substrate by sputtering a target using plasma and includes a vacuum chamber which is evacuated to a vacuum and into which a gas is introduced, a substrate holding part which holds the substrate in the vacuum chamber, a target holding part which faces the substrate and holds the target in the vacuum chamber, a plurality of antennas arranged along a surface of the substrate held by the substrate holding part and configured to generate the plasma, and a reciprocating scanning mechanism which scans the substrate held by the substrate holding part back and forth along an arrangement direction of the plurality of the antennas.

In such a sputtering device, since the substrate held by the substrate holding part is scanned back and forth along an arrangement direction of the antennas, variations in film thickness due to density gradation in distribution of the plasma and density gradation in distribution of sputtered particles in the arrangement direction of the antennas can be reduced, and uniformity of the film deposition can be improved. Also, since the plasma for sputtering is generated using the antennas, the target can be consumed uniformly compared to that in a magnetron sputtering device, and thus efficiency of use of the target can be improved.

In the case of the configuration in which the target holding part holds a target having a rectangular shape in a plan view, in order to efficiently sputter the target, it is preferable that the antennas have a linear shape in a plan view and be disposed parallel to a longitudinal direction of the target. In this configuration, the arrangement direction of the antennas is a direction perpendicular to the longitudinal direction of the antennas, and the substrate held by the substrate holding part is scanned back and forth in the direction perpendicular to the longitudinal direction of the antennas.

In order to cope with a large substrate or the like, it is preferable that a plurality of the target holding parts be provided and the plurality of the target holding parts be arranged at regular intervals, and the plurality of the antennas be arranged at regular intervals and disposed on both sides of the target held by the respective target holding parts. In this configuration, although the sputtered particles ejected from the respective targets overlap each other and generate a periodic distribution in the arrangement direction of the antennas, when the substrate is scanned back and forth in the arrangement direction of the antennas as in the present invention, unevenness of the film thickness due to the periodic distribution can be reduced.

In order to uniformly consume the respective targets, it is conceivable that a pitch width of a plurality of the targets and a pitch width of the plurality of the antennas are the same. In this configuration, it is preferable that the scanning mechanism set a scanning range of the substrate holding part to the pitch width.

In order not only to make the film thickness in the arrangement direction of the antennas uniform but also to make the film thickness in the longitudinal direction of the antennas uniform, each of the antennas preferably includes at least two conductor elements, an insulating element provided between the conductor elements adjacent to each other to insulate the conductor elements, and a capacitive element electrically connected in series to the conductor elements adjacent to each other.

According to the present invention configured as described above, since the substrate held by the substrate holding part is scanned back and forth in the arrangement direction of the antennas, uniformity of the film deposition can be improved when the plasma for sputtering is generated using the plurality of antennas.

DESCRIPTION OF EMBODIMENTS

Hereinafter, one embodiment of a sputtering device according to the present invention will be described with reference to the drawings.

<Device Configuration>

A sputtering device 100 of the present embodiment deposits a film on a substrate W by sputtering a target T using an inductively coupled plasma P. Here, the substrate W may be, for example, a substrate for a flat panel display (FPD) such as a liquid crystal display or an organic electroluminescence (EL) display, a flexible substrate for a flexible display, or the like.

Figure 1:
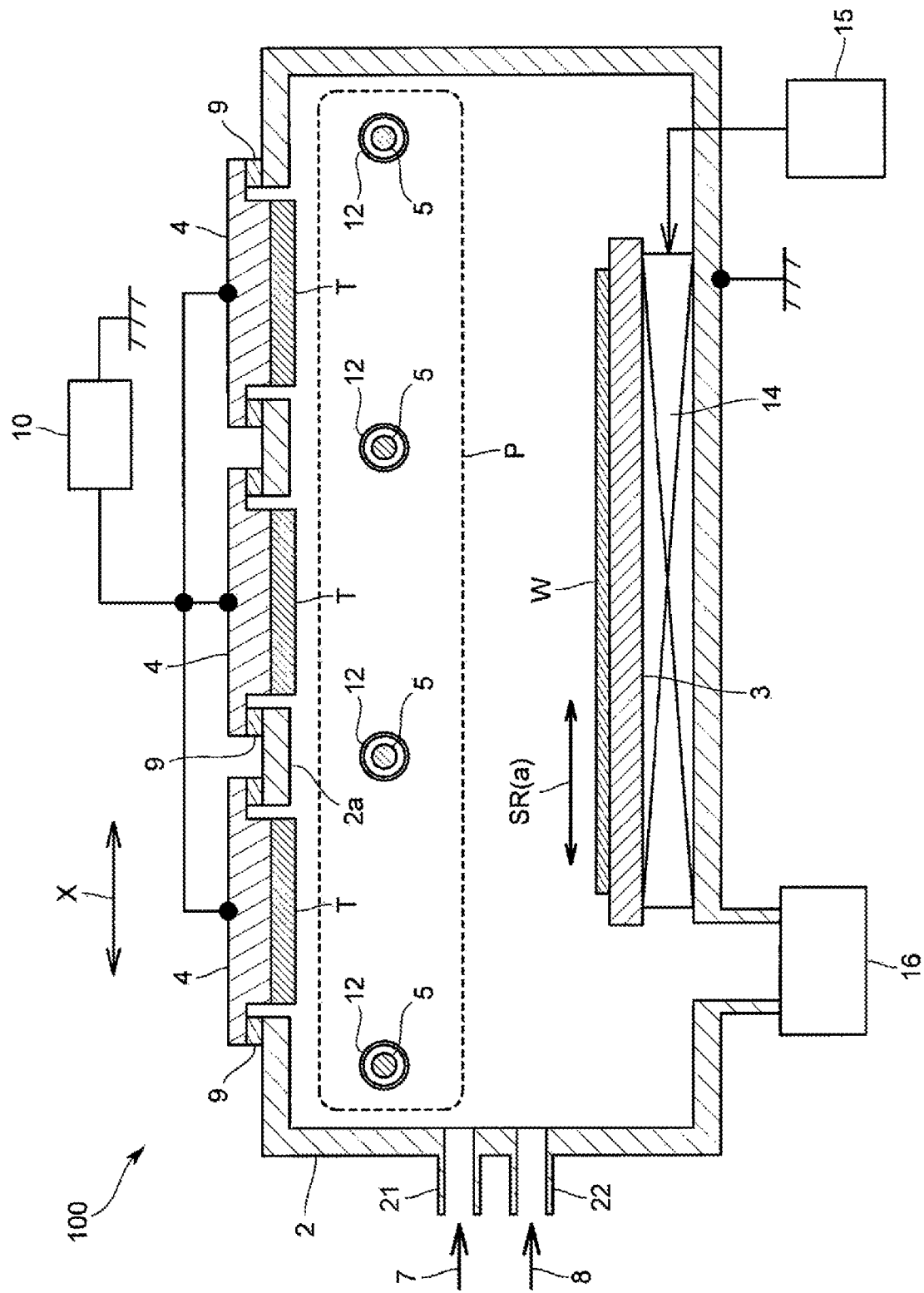
FIG. 1 is a longitudinal sectional view perpendicular to a longitudinal direction of an antenna schematically illustrating a configuration of a sputtering device of the present embodiment.
Figure 2:
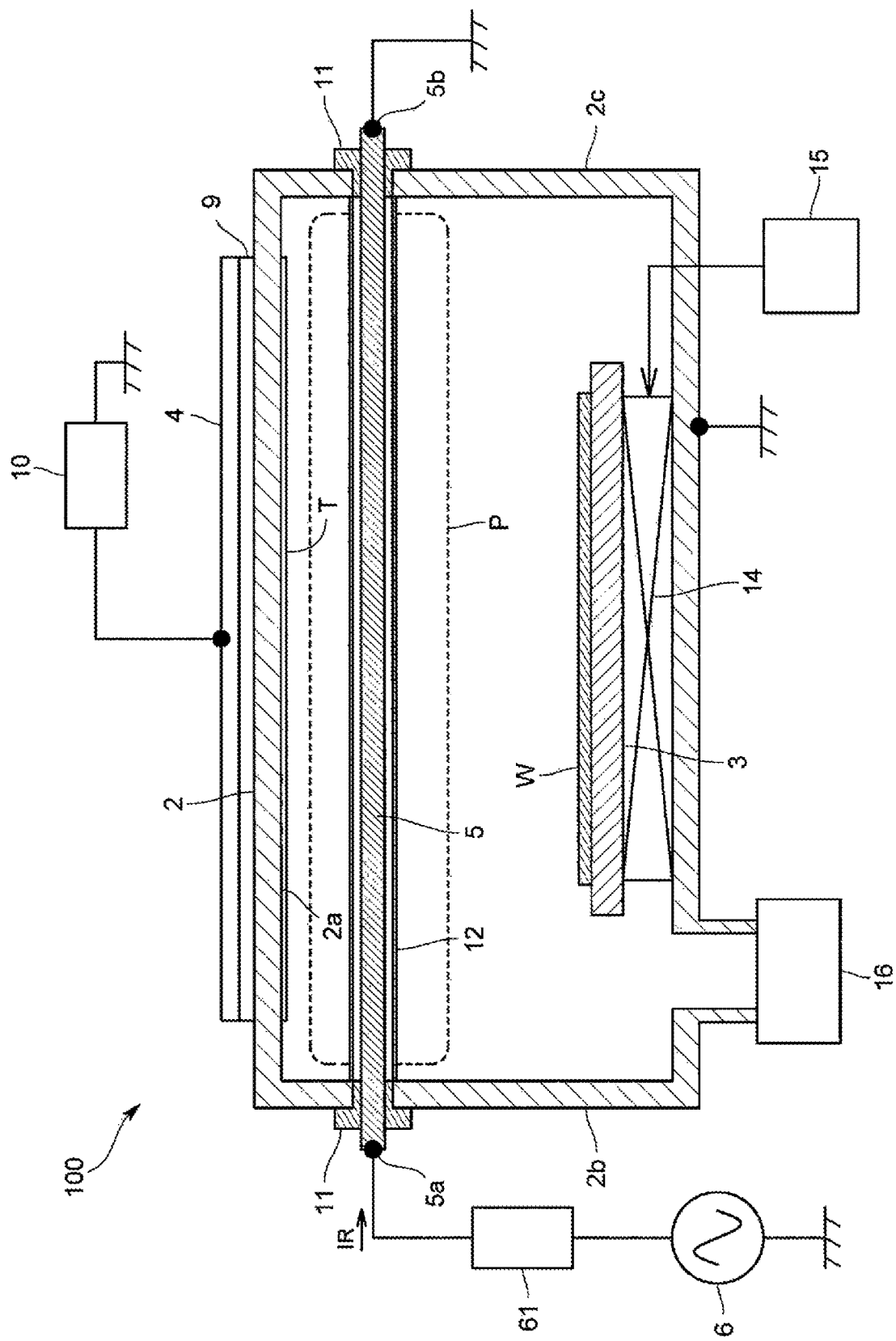
FIG. 2 is a longitudinal sectional view in the longitudinal direction of the antenna schematically illustrating a configuration of the sputtering device of the present embodiment.

Specifically, as illustrated in FIGS. 1 and 2, the sputtering device 100 includes a vacuum chamber 2 which is evacuated to a vacuum and into which a gas is introduced, a substrate holding part 3 which holds the substrate W in the vacuum chamber 2, a target holding part 4 which holds the target T in the vacuum chamber 2, a plurality of antennas 5 having a linear shape and disposed in the vacuum chamber 2, and a high-frequency power supply 6 which applies a high frequency for generating the inductively coupled plasma P in the vacuum chamber 2 to the plurality of antennas 5. When a high frequency is applied from the high-frequency power supply 6 to the plurality of antennas 5, a high-frequency current IR flows in the plurality of antennas 5 to generate an induction electric field in the vacuum chamber 2, and thereby the inductively coupled plasma P is generated.

The vacuum chamber 2 may be, for example, a metal chamber, and an inside thereof is evacuated to a vacuum by a vacuum evacuation device 16. The vacuum chamber 2 is electrically grounded in this example.

A sputtering gas 7 or a reactive gas 8 is introduced into the vacuum chamber 2 via, for example, a flow rate regulator (not illustrated) and a plurality of gas inlet ports 21 and 22. The sputtering gas 7 and the reactive gas 8 may be made to correspond to a processing content to be applied to the substrate W. The sputtering gas 7 may be, for example, an inert gas such as argon (Ar), and the reactive gas 8 may be, for example, oxygen ($O_2$), nitrogen ($N_2$), or the like.

The substrate holding part 3 is a holder that holds the substrate W having a flat plate shape, for example, in a horizontal state in the vacuum chamber 2. The substrate holding part 3 is configured to be linearly scanned back and forth in the vacuum chamber 2 as will be described below.

The target holding part 4 holds the target T to face the substrate W held by the substrate holding part 3. The target T of the present embodiment has a flat plate shape formed in a rectangular shape in a plan view. The target holding part 4 is provided on a side wall 2a (for example, an upper side wall) forming the vacuum chamber 2. Also, an insulating part 9 having a vacuum seal function is provided between the target holding part 4 and the upper side wall 2a of the vacuum chamber 2. A target bias power supply 10 for applying a target bias voltage to the target T is connected to the target T via the target holding part 4 in this example. The target bias voltage is a voltage that draws ions in the plasma P into the target T for sputtering.

Figure 3:
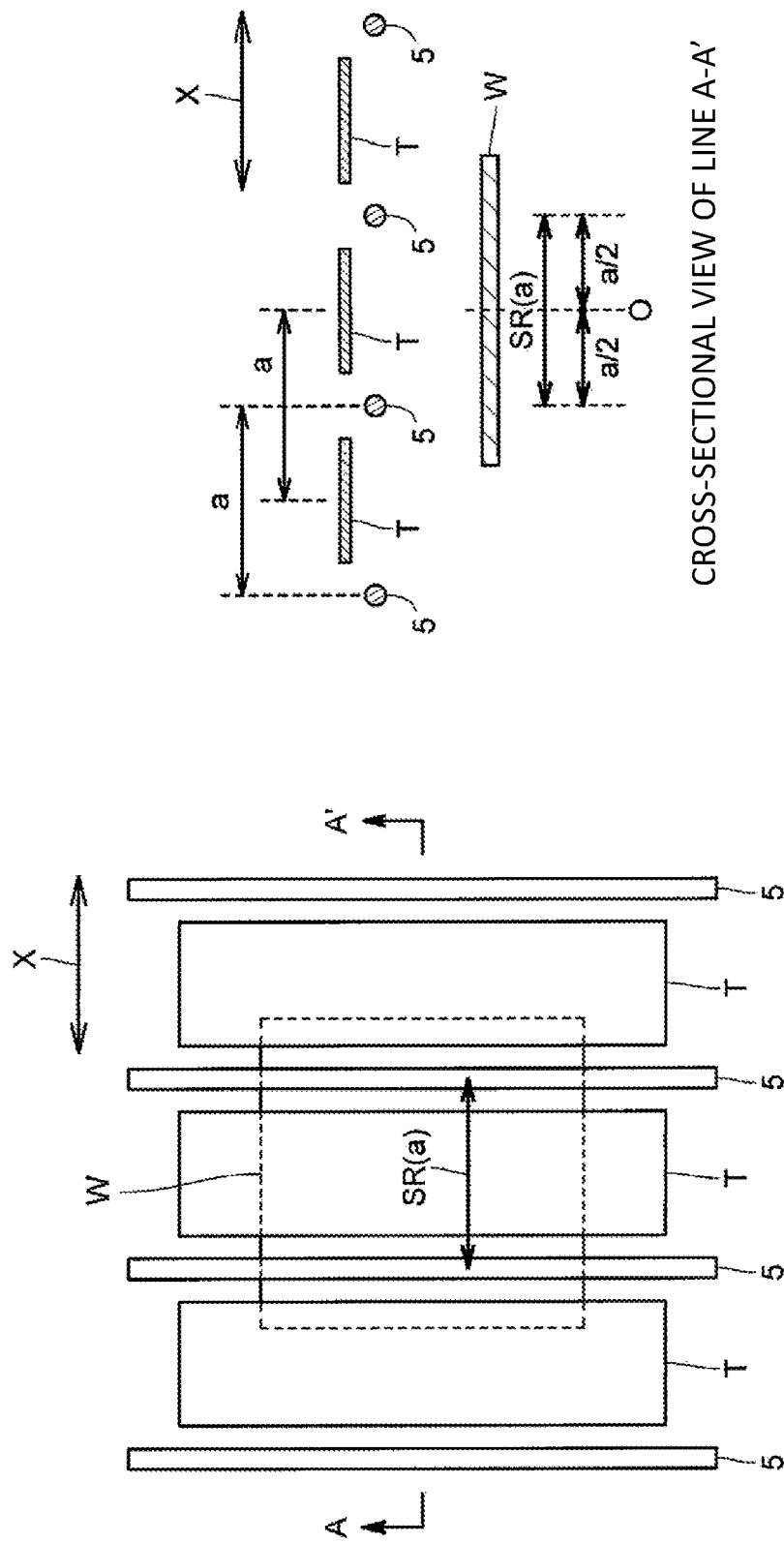
FIG. 3 is a schematic view illustrating a positional relationship between an antenna, a target, and a substrate of the present embodiment.

In the present embodiment, a plurality of target holding parts 4 is provided. The plurality of target holding parts 4 is disposed in parallel on the same plane along a surface of the substrate W (for example, substantially parallel to a surface of the substrate W) on the surface side of the substrate W in the vacuum chamber 2. The plurality of target holding parts 4 is disposed at regular intervals so that longitudinal directions thereof are parallel to each other. Thereby, as illustrated in FIGS. 1 and 3, the plurality of targets T disposed in the vacuum chamber 2 is substantially parallel to the surface of the substrate W and is disposed at regular intervals so that longitudinal directions thereof are parallel to each other. Further, the target holding parts 4 each have the same configuration.

The plurality of antennas 5 is disposed in parallel on the same plane along the surface of the substrate W (for example, substantially parallel to the surface of the substrate W) on the surface side of the substrate W in the vacuum chamber 2. The plurality of antennas 5 is disposed at regular intervals so that longitudinal directions thereof are parallel to each other. Further, the antennas 5 have linear shapes in a plan view, each have the same configuration, and each have a length of tens of centimeters or more.

As illustrated in FIGS. 1 and 3, the antennas 5 of the present embodiment are disposed at both sides of the respective targets T held by the target holding parts 4. That is, the antennas 5 and the targets T are alternately disposed, and one of the targets T is configured to be sandwiched between two antennas 5. Here, a longitudinal direction of each of the antennas 5 and a longitudinal direction of the target T held by each of the target holding parts 4 are the same direction. Also, as illustrated particularly in FIG. 3, the plurality of targets T and the plurality of antennas 5 are disposed to have the same pitch width (pitch width a, for both). Further, the antenna 5 disposed between two targets T is disposed at a position equidistant from the two targets T.

Also, a material of the antenna 5 may be, for example, copper, aluminum, an alloy of these, stainless steel, or the like, but is not limited thereto. Further, the antenna 5 may be made hollow inside and a refrigerant such as cooling water may be caused to flow therethrough to cool the antenna 5.

Further, as illustrated in FIG. 2, vicinities of opposite end portions of the antenna 5 penetrate side walls 2b and 2c of the vacuum chamber 2 facing each other. Insulating members 11 are provided at portions through which the opposite end portions of the antenna 5 penetrate the vacuum chamber 2 to the outside. The opposite end portions of the antenna 5 penetrate the respective insulating members 11, and penetration portions thereof are vacuum sealed by, for example, packing. Spaces between the insulating members 11 and the vacuum chamber 2 are also vacuum sealed, for example, by packing. A material of the insulating members 11 may be, for example, a ceramic including alumina or the like, quartz, or an engineering plastic such as polyphenylene sulfide (PPS) or polyether ether ketone (PEEK).

Further, in each of the antennas 5, a portion positioned in the vacuum chamber 2 is covered with an insulating cover 12 having a straight tubular shape made of an insulator. It is not necessary to seal between opposite end portions of the insulating cover 12 and the vacuum chamber 2. This is because, even if the gas 7 enters a space in the insulating cover 12, since the space is small and movement distances of electrons are small, the plasma P is not normally generated in the space. Further, a material of the insulating cover 12 may be, for example, quartz, alumina, a fluorine resin, silicon nitride, silicon carbide, silicon, or the like, but is not limited thereto.

The high-frequency power supply 6 is connected to a power feeding end part 5a which is one end portion of the antenna 5 via a matching circuit 61, and a terminal part 5b which is the other end portion of the antenna 5 is directly grounded. Further, it may be configured with an impedance adjusting circuit such as a variable capacitor or variable reactor provided at the power feeding end part 5a or the terminal part 5b to adjust impedance of each antenna 5. When the impedance of each antenna 5 is adjusted as described above, a density distribution of the plasma P in the longitudinal direction of the antenna 5 can be made uniform, and a film thickness in the longitudinal direction of the antenna 5 can be made uniform.

With the above-described configuration, the high-frequency current IR can be caused to flow from the high-frequency power supply 6 to the antenna 5 via the matching circuit 61. The high frequency may be, for example, a general frequency of 13.56 MHz, but is not limited thereto.

The sputtering device 100 according to the present embodiment includes a reciprocating scanning mechanism 14 that scans the substrate W held by the substrate holding part 3 back and forth along an arrangement direction X of the antennas 5.

The reciprocating scanning mechanism 14 causes the substrate holding part 3 to be mechanically scanned back and forth in the arrangement direction X of the antennas 5 so that the substrate W held by the substrate holding part 3 is scanned on the same plane back and forth in the arrangement direction X. A forward path and a backward path of the substrate W by the reciprocating scanning mechanism 14 are linear movements, and the forward path and the backward path are configured to overlap each other. Further, it is conceivable that the reciprocating scanning mechanism 14 may include, for example, an actuator provided outside the vacuum chamber 2, and a linear guide connected to the substrate holding part 3 and driven by the actuator.

Also, as illustrated in FIG. 3, the reciprocating scanning mechanism 14 is configured such that a scanning range SR of the substrate W has the above-described pitch width a. Specifically, the scanning range SR of the substrate W is configured to have the above-described pitch width a by a control device 15 that controls the reciprocating scanning mechanism 14. That is, the substrate W is scanned back and forth with an amplitude of ±a/2 with an initial position as a center position O.

Figure 4:
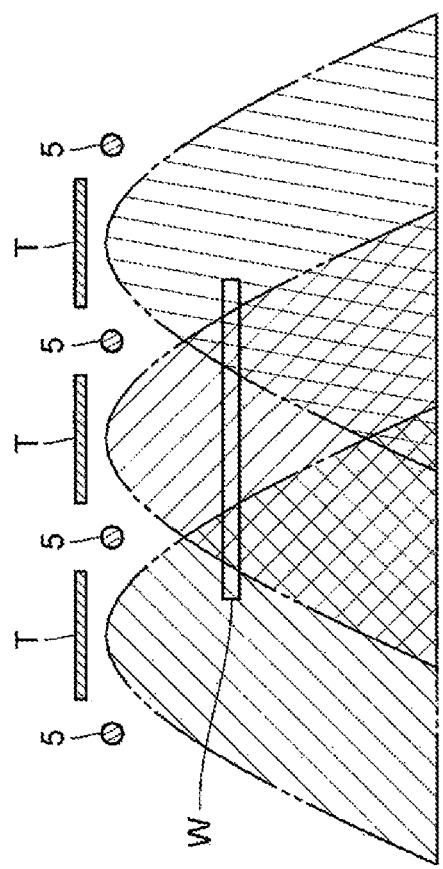
FIG. 4 is a schematic view showing a diffusion distribution of sputtered particles of the present embodiment.

In the case of the configuration in which the plurality of targets T and the plurality of antennas 5 are alternately disposed as in the present embodiment, diffusion ranges of sputtered particles ejected from the respective targets T overlap each other as illustrated in FIG. 4, and when the substrate W is not scanned, a distribution of a film thickness and a film quality corresponding to the pitch a may occur on the substrate surface. Here, since the scanning range SR of the substrate W by the reciprocating scanning mechanism 14 is set to the pitch width a, the distribution of the film thickness and the film quality of the pitch a which may occur on the substrate surface is made uniform, and thereby uniformity of film deposition can be improved.

Figure 5:
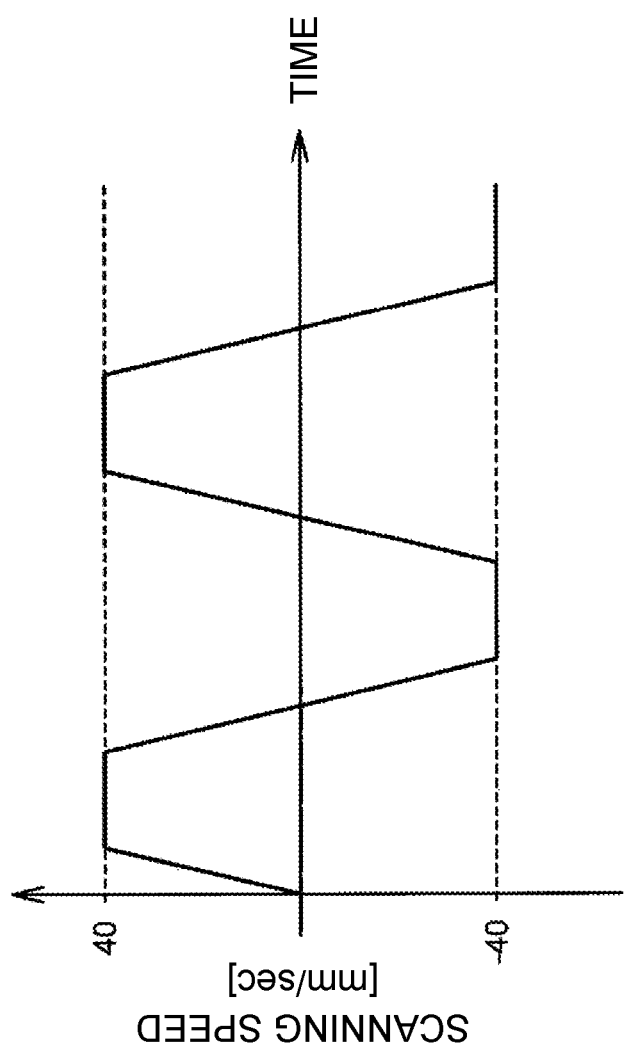
FIG. 5 is a view showing a waveform of a scanning speed of the substrate by a reciprocating scanning mechanism of the present embodiment.

Here, as illustrated in FIG. 5, a scanning speed of the substrate W by the reciprocating scanning mechanism 14 is basically a constant speed (for example, 40 mm/sec) and is configured to be reduced at vicinities including turning points of the forward path and the backward path. In the present embodiment, a waveform of the scanning speed is a trapezoidal wave. By controlling the speed in this manner, positional deviation of the substrate W due to an inertial force is prevented at the turning point. In addition, the waveform of the scanning speed of the substrate W may be a sine wave or a triangular wave.

Example

In the sputtering device 100 of the present embodiment, uniformity of film deposition when the scanning speed of the substrate W was changed was evaluated. The target T used was IGZO 1114, and a size thereof was 150×1000 mm. A distance between the antennas (pitch width a) was 200 mm. A distance between the target and the substrate was 125 mm. A size of the substrate W was 320×400 mm.

After evacuating the vacuum chamber 2 to $3 \times 10^{-6}$ Torr or lower, a pressure in the vacuum chamber 2 was adjusted to 0.9 Pa while 100 sccm of a sputtering gas (Ar gas) was introduced. A high-frequency power of 7 kW was supplied to the plurality of antennas 5 to generate and maintain the inductively coupled plasma P. A direct current (DC) voltage pulse of −350 V was applied to the target T to perform sputtering of the target T, and film deposition processing was performed until a film thickness on the substrate W became 50 nm.

In this film deposition processing, the scanning range SR of the substrate W by the reciprocating scanning mechanism 14 was set to 200 mm which is a distance between the antennas, and uniformity of the film deposition obtained at each scanning speed of 0 (without reciprocating scanning), 14 mm/sec, 20 mm/sec, 27 mm/sec, 40 mm/sec, 48 mm/sec, 55 mm/sec, 68 mm/sec, and 82 mm/sec was evaluated. The film deposition uniformity was evaluated by a ratio of a maximum value to a minimum value of the film thickness deposited on the substrate W.

Figure 6:
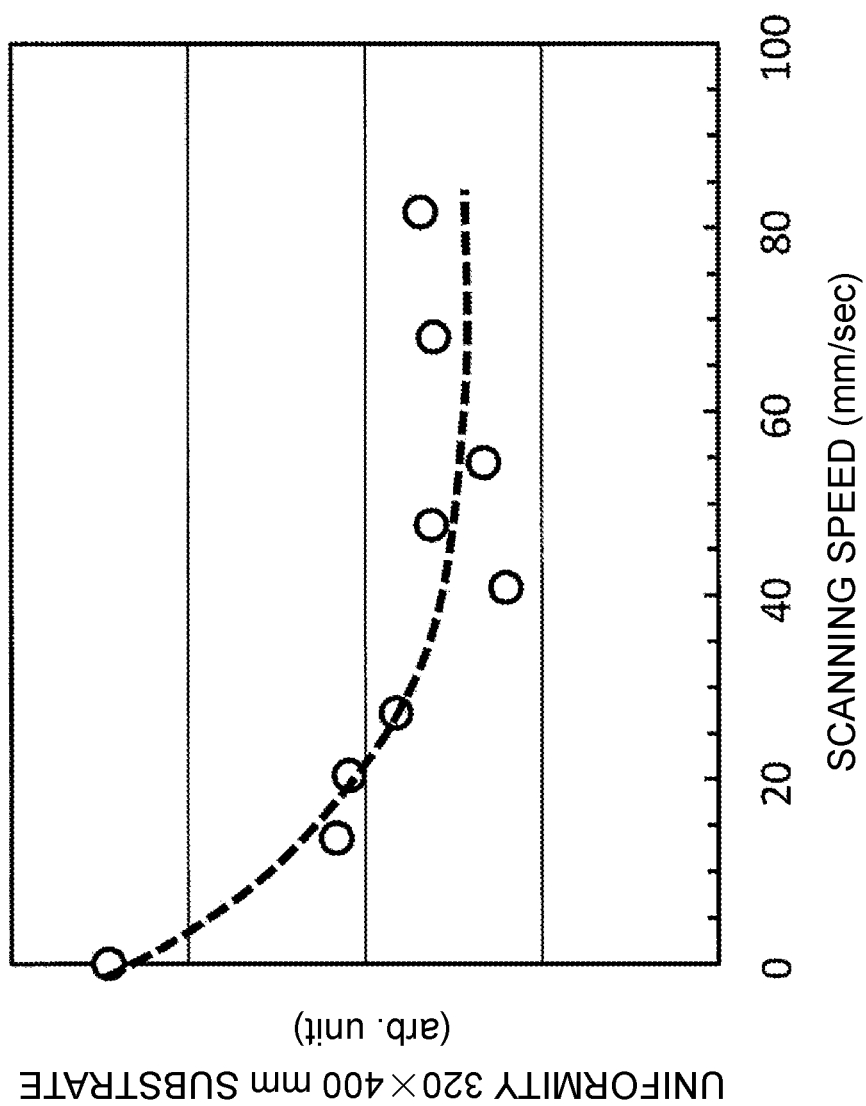
FIG. 6 is a graph showing a relationship between the scanning speed and uniformity of film deposition of the substrate.

A graph of the uniformity at each scanning speed is illustrated in FIG. 6. As can be understood from FIG. 6, when the scanning range SR of the substrate W by the reciprocating scanning mechanism 14 was set to the distance between the antennas and the substrate W was scanned back and forth, the uniformity of the film deposition was improved. Also, as the scanning speed was increased, the uniformity of the film deposition was improved and became almost constant at the scanning speed of 40 mm/sec or more. Therefore, it is preferable to set the scanning speed to 40 mm/sec or higher.

Effects of Present Embodiment

According to the sputtering device 100 of the present embodiment configured as described above, since the substrate W held by the substrate holding part 3 is scanned back and forth in the arrangement direction X of the antennas 5, variations in film thickness due to density gradation of the plasma P and density gradation of the sputtered particles in the arrangement direction X of the antennas 5 can be reduced, and uniformity of the film deposition can be improved.

In the case of the configuration in which the plurality of targets T and the plurality of antennas 5 are alternately disposed particularly as in the present embodiment, while periodic density gradation of the sputtered particles is likely to occur, variations in film thickness due to the periodic density gradation of sputtered particles is reduced by scanning the substrate W back and forth using the reciprocating scanning mechanism 14, and thereby uniformity of the film deposition can be improved.

Here, in order to miniaturize the vacuum chamber 2 as well as to increase a film deposition rate, it is conceivable to reduce distances between the targets T and the substrate W, then, overlapping effects of the sputtered particles ejected from the plurality of targets T are reduced, and the uniformity is deteriorated. In the present embodiment, since the substrate W is scanned back and forth, even when the distances between the targets T and the substrate W are reduced, uniformity of the film deposition can be improved.

Also, in the present embodiment, since the plasma P for sputtering is generated using the antenna 5 without using a magnet for plasma generation, the target T can be uniformly consumed compared to that in a magnetron sputtering device, and thus efficiency of use of the target can be improved.

Further, in the present embodiment, since the rectangular target T is used, costs can be reduced, for example, compared to a case in which a target having a special shape such as a circular cross section is used. Also, since the plurality of targets T is used, an area of each of the targets T can be reduced and this allows satisfactory yield in manufacturing the target compared to a case in which a large area target is manufactured, and thereby the costs can also be reduced.

OTHER MODIFIED EMBODIMENTS

The present invention is not limited to the above-described embodiment.

For example, the scanning range SR of the substrate W by the reciprocating scanning mechanism may be smaller than the pitch width a. Also in this case, variations in film thickness due to density gradation of the plasma P and density gradation of the sputtered particles in the arrangement direction X of the antennas 5 can be reduced, and uniformity of film deposition can be improved.

Regarding the configuration of the antenna 5, the antenna 5 may be bent as long as it is linear in a plan view or may be segmented in the longitudinal direction of the antenna 5 and constituted of a plurality of antennas. Also, with the following configuration, not only the film thickness in the arrangement direction X of the antennas 5 can be made uniform, but also the film thickness in the longitudinal direction of the antenna 5 can be made uniform.

Figure 7:
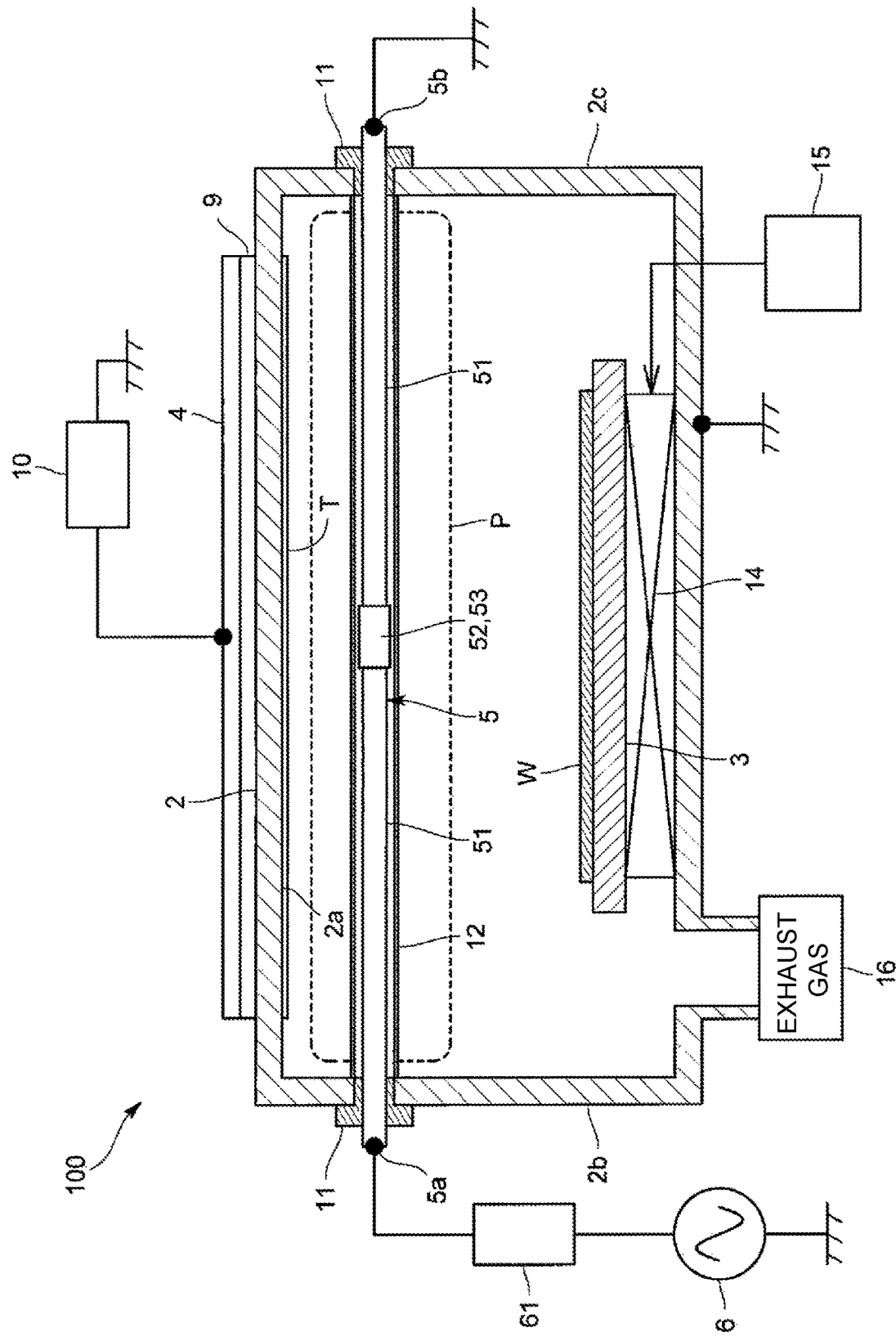
FIG. 7 is a longitudinal sectional view in a longitudinal direction of an antenna schematically illustrating a configuration of a sputtering device of a modified embodiment.

Specifically, as illustrated in FIG. 7, an antenna 5 includes at least two metal conductor elements 51, an insulating element 52 provided between the conductor elements 51 adjacent to each other and insulating the conductor elements 51, and a capacitor 53 which is a capacitive element electrically connected in series to the conductor elements 51 adjacent to each other. Further, the conductor elements 51 and the insulating element 52 have a tubular shape in which a cooling liquid CL flows. In FIG. 7, the number of conductor elements 51 is two, and the number of insulating element 52 and capacitor 53 is one each. Further, the antenna 5 may be configured to have three or more conductor elements 51, and in this case, the numbers of insulating elements 52 and capacitors 53 are both one fewer than the number of the conductor elements 51.

The conductor elements 51 have a straight tubular shape, and a material of the conductor elements 51 may be, for example, copper, aluminum, an alloy of these, stainless steel, or the like. Also, the insulating element 52 has a straight tubular shape, and a material of the insulating element 52 may be, for example, alumina, a fluorine resin, polyethylene (PE), an engineering plastic (for example, polyphenylene sulfide (PPS), polyether ether ketone (PEEK), or the like), or the like.

Figure 8:
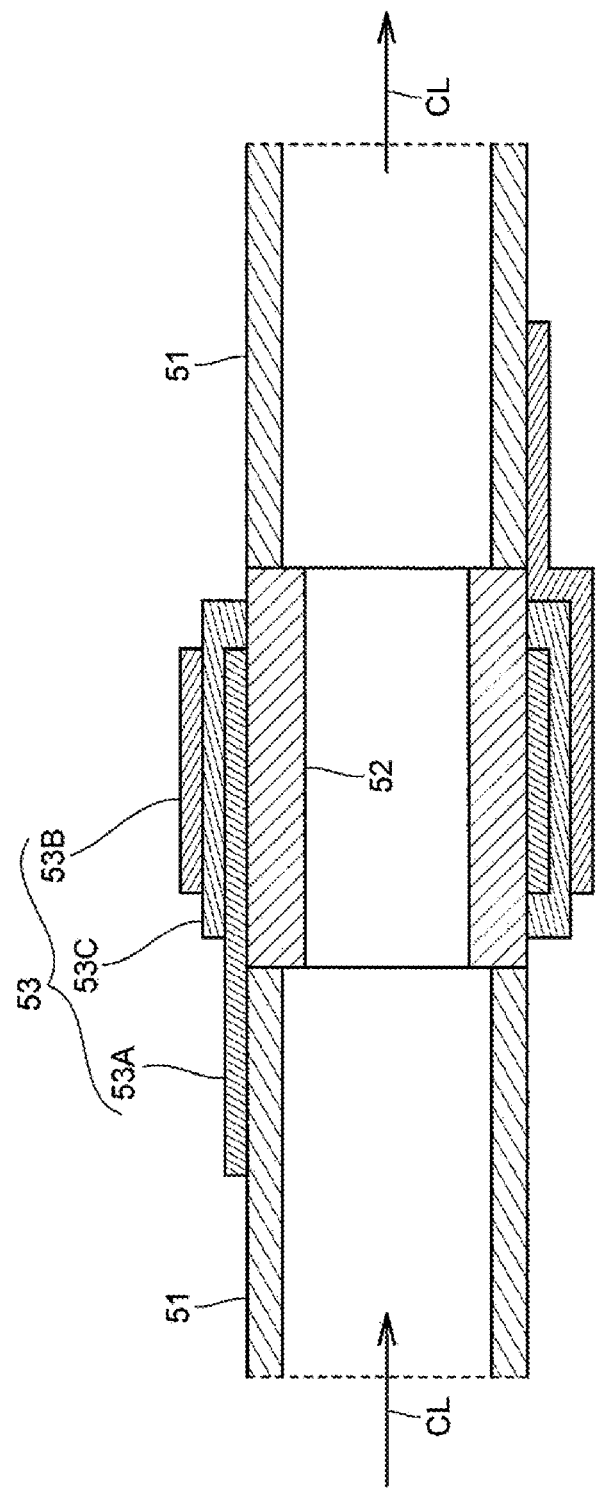
FIG. 8 is a partially enlarged cross-sectional view illustrating a capacitor portion in an antenna of the modified embodiment.

As illustrated in FIG. 8, the capacitor 53 may have, for example, a layered shape disposed on an outer circumferential portion of the insulating element 52. Specifically, the capacitor 53 is disposed on the outer circumferential portion of the insulating element 52 and includes a first electrode 53A electrically connected to one of the conductor elements 51, a second electrode 53B disposed to face the first electrode 53A on the outer circumferential portion of the insulating element 52 and electrically connected to the other of the conductor elements 51, and a dielectric 53C disposed between the first electrode 53A and the second electrode 53B.

The first electrode 53A and the second electrode 53B may be, for example, a metal film, a foil, a film, a sheet, or the like. A material of the first electrode 53A and the second electrode 53B may be, for example, aluminum, copper, an alloy of these, or the like.

A material of the dielectric 53C may be, for example, polyethylene terephthalate (PET), polypropylene (PP), polyphenylene sulfide (PPS), polyethylene naphthalate (PEN), polyimide (PI), or the like.

The capacitor 53 of this configuration may have, for example, a structure in which the electrodes 53A and 53B are formed on both main surfaces of the film-like dielectric 53C by metal deposition or the like and this is wound around the outer circumferential portion of the insulating element 52 a predetermined number of times, and other structures may also be used.

When the antenna 5 is configured in this manner, since combined reactance of the antenna 5 is, to put it simply, a form obtained by subtracting capacitive reactance from inductive reactance, impedance of the antenna 5 can be reduced. As a result, even when the antenna 5 is elongated, an increase in the impedance can be suppressed, the high-frequency current IR can easily flow to the antenna 5, and thereby the inductively coupled plasma P can be efficiently generated. Therefore, a density distribution of the plasma P in the longitudinal direction of the antenna 5 can be made uniform, and the film thickness in the longitudinal direction of the antenna 5 can also be made uniform.

Figure 9:
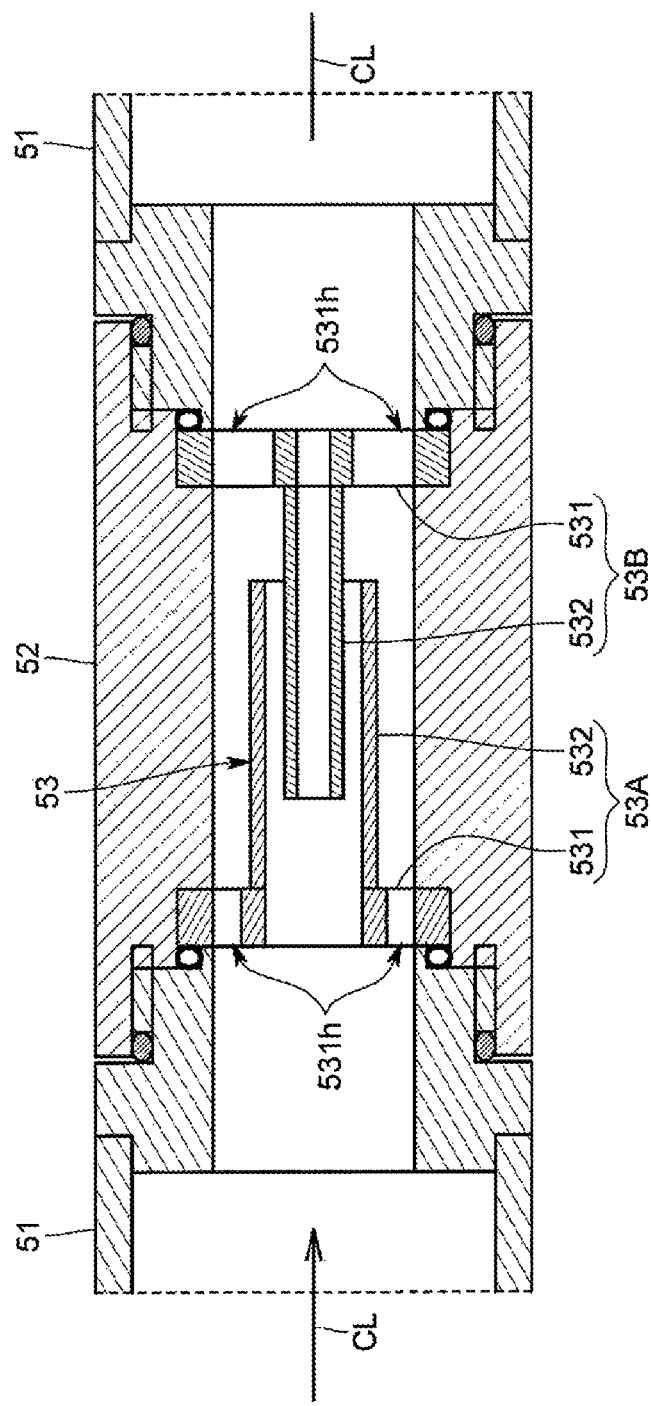
FIG. 9 is a partially enlarged cross-sectional view illustrating a capacitor portion in an antenna of the modified embodiment.

Also, the dielectric 53C of the capacitor 53 may be formed of, for example, the cooling liquid CL such as water. In this case, the capacitor 53 is configured to be provided in a flow path through which the cooling liquid CL flows. For example, as illustrated in FIG. 9, the capacitor 53 is configured to be provided inside the insulating element 52, that is, configured to be provided in the flow path through which the cooling liquid CL of the insulating element 52 flows.

Specifically, the capacitor 53 includes the first electrode 53A electrically connected to the metal element 51 on one side of the insulating element 52, and the second electrode 53B electrically connected to the metal element 51 on the other side of the insulating element 52 and disposed to face the first electrode 53A, and a space between the first electrode 53A and the second electrode 53B is configured to be filled with the cooling liquid CL. That is, the cooling liquid CL flowing through the space between the first electrode 53A and the second electrode 53B serves as a liquid dielectric constituting the capacitor 53. Each of the electrodes 53A and 53B has substantially a rotating body shape, and a flow path is formed in a center portion along a central axis thereof. Specifically, each of the electrodes 53A and 53B includes a flange part 531 in electrical contact with an end portion of the metal element 51 on the insulating element 52 side, and an extending part 532 formed, for example, in a cylindrical shape and extending from the flange part 531 to the insulating element 52 side. The flange part 531 is sandwiched between the metal element 51 and the insulating element 52. Also, a through hole 531h through which cooling water flows is formed also in the flange part.

Since the space between the first electrode 53A and the second electrode 53B is filled with the liquid dielectric (the cooling liquid CL), a gap formed between the electrodes 53A and 53B and the dielectric which constitute the capacitor 53 can be eliminated. As a result, an arc discharge that may occur in the gap between the electrodes 53A and 53B and the dielectric can be eliminated, and a breakage of the capacitor 53 due to the arc discharge can be eliminated. Also, a capacitance value can be accurately set from a distance and a facing area between the extending part 532 of the first electrode 53A and the extending part 532 of the second electrode 53B, and relative permittivity of the liquid dielectric (the cooling liquid CL) without considering the gap. Further, a structure of pressing the electrodes 53A and 53B and the dielectric for filling the gap can also be unnecessary, and a complicated structure around the antenna due to the pressing structure and deterioration in uniformity of the plasma P caused thereby can be prevented.

Further, a portion of the metal element 51 on one side of the insulating element 52 may be used as the first electrode 53A. In this case, it is conceivable that the second electrode 53B electrically connected to the metal element 51 on the other side of the insulating element 52 is configured to extend to an inside of the metal element 51 on one side of the insulating element 52 through an inside of the insulating element 52.

In addition, the present invention is not limited to the above embodiments and various modifications can be made within the scope not departing from the gist of the present invention as a matter of course.

EXPLANATION OF REFERENCES

100 Sputtering device
W Substrate
P Plasma
T Target
2 Vacuum chamber
3 Substrate holding part
4 Target holding part
5 Antenna
14 Reciprocating scanning mechanism
51 Conductor element
52 Insulating element
53 Capacitor

What is claimed is:

1. A sputtering device, which deposits a film on a substrate by sputtering a plurality of targets using plasma, the sputtering device comprising:
    a vacuum chamber which is evacuated to a vacuum and into which a gas is introduced;
    a substrate holding part which holds the substrate in the vacuum chamber;
    a plurality of target holding parts which faces the substrate and holds each target in the vacuum chamber, wherein the plurality of the target holding parts is arranged at regular intervals;
    a plurality of antennas arranged along a surface of the substrate held by the substrate holding part and configured to generate the plasma, wherein the antennas have a linear shape in a plan view, the plurality of the antennas is arranged at regular intervals and disposed on both sides of each target held by each of the target holding parts, opposite end portions of each antenna penetrate side walls of the vacuum chamber facing each other; and
    a reciprocating scanning mechanism which scans the substrate held by the substrate holding part back and forth along an arrangement direction of the plurality of the antennas,
    a pitch width of the plurality of the targets and a pitch width of the plurality of the antennas are the same, and
    a controller configured to control the reciprocating scanning mechanism such that a scanning range of the substrate holding part is set to the pitch width in the reciprocating scanning mechanism.

2. The sputtering device according to claim 1, wherein each target holding part holds each target having a rectangular shape in a plan view.

3. The sputtering device according to claim 1, wherein each of the antennas includes:
    at least two conductor elements;
    an insulating element provided between the conductor elements adjacent to each other to insulate the conductor elements; and
    a capacitive element electrically connected in series to the conductor elements adjacent to each other.

* * * * *